US010380070B2

(12) United States Patent
Kawamura et al.

(10) Patent No.: US 10,380,070 B2
(45) Date of Patent: Aug. 13, 2019

(54) READING AND WRITING A HEADER AND RECORD ON TAPE

(71) Applicant: International Business Machines Corporation, Armonk, NY (US)

(72) Inventors: Kousei Kawamura, Tokyo (JP); Kohichi Masuda, Tokyo (JP); Sosuke Matsui, Tokyo (JP); Yutaka Oishi, Kanagawa (JP); Takahiro Tsuda, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 650 days.

(21) Appl. No.: 14/938,945

(22) Filed: Nov. 12, 2015

(65) Prior Publication Data

US 2017/0139946 A1 May 18, 2017

(51) Int. Cl.
*G06F 16/174* (2019.01)
*G06F 3/06* (2006.01)
(Continued)

(52) U.S. Cl.
CPC ........ *G06F 16/1744* (2019.01); *G06F 3/0608* (2013.01); *G06F 3/0613* (2013.01);
(Continued)

(58) Field of Classification Search
CPC ......... G06F 17/30153; G06F 17/30371; G06F 17/30138; G06F 17/30312;
(Continued)

(56) References Cited

U.S. PATENT DOCUMENTS 5,280,600 A 1/1994 Van Maren et al.
8,751,515 B1 * 6/2014 Xing ................. G06F 17/30073
707/755

(Continued)

OTHER PUBLICATIONS

"Encryption technology for HP StoreEver LTO Ultrium Tape Drives (LTO-4, LTO-5, and LTO-6)", hp, Technical white paper, © Copyright 2007, 2010, 2012 Hewlett-Packard Development Company, L.P., 4AA1-4878ENW, Created Sep. 2007; Updated Dec. 2012, Rev. 3, pp. 1-18.

*Primary Examiner* — Dung K Chau
(74) *Attorney, Agent, or Firm* — Christopher K. McLane

(57) ABSTRACT

As disclosed herein, a computer implemented method for reading a record on a storage device includes reading, by a processor, the record from the storage device, and generating, by a processor, a header corresponding to the record. The method further includes adding, by a processor, header information corresponding to the metadata to the header, and providing, by a processor, the header and the record to a host. Also disclosed herein, a computer implemented method for writing a record on a storage device includes receiving, by a processor, a header and the record from a host to be written to the storage device, and determining, by a processor, metadata included in header information corresponding to the header. The method further includes determining, by a processor, a write behavior specified by the metadata, and writing, by a processor, the metadata and the record to the storage device according to the write behavior.

18 Claims, 5 Drawing Sheets

(51) Int. Cl.
*G11B 5/008* (2006.01)
*H03M 7/30* (2006.01)

(52) U.S. Cl.
CPC .......... *G06F 3/0659* (2013.01); *G06F 3/0682* (2013.01); *G11B 5/00817* (2013.01); *H03M 7/30* (2013.01); *H03M 7/6052* (2013.01)

(58) Field of Classification Search
CPC ......... G06F 17/30569; G06F 17/30091; G06F 16/1744; G06F 3/0608; G06F 3/0613; G06F 3/0659; G06F 3/0682
USPC .................. 707/693, 755, 999.001, 999.201; 711/103, 111
See application file for complete search history.

(56) References Cited

U.S. PATENT DOCUMENTS

| | | | | |
|---|---|---|---|---|
| 9,852,151 | B1* | 12/2017 | Youngworth | G06F 3/0665 |
| 2004/0117037 | A1* | 6/2004 | Hinshaw | G06F 17/30477 |
| | | | | 700/2 |
| 2006/0101206 | A1* | 5/2006 | Wood | G06F 12/0802 |
| | | | | 711/122 |
| 2007/0094309 | A1* | 4/2007 | Buckingham | G06F 21/78 |
| 2007/0180272 | A1* | 8/2007 | Trezise | G06F 11/1448 |
| | | | | 713/193 |
| 2007/0283417 | A1* | 12/2007 | Smolen | G06F 17/30348 |
| | | | | 726/2 |
| 2007/0299885 | A1* | 12/2007 | Pareek | G06F 17/30563 |
| 2008/0066192 | A1 | 3/2008 | Greco et al. | |
| 2008/0229037 | A1* | 9/2008 | Bunte | G06F 11/1451 |
| | | | | 711/162 |
| 2008/0263363 | A1* | 10/2008 | Jueneman | G06F 21/32 |
| | | | | 713/184 |
| 2009/0300037 | A1* | 12/2009 | Kariv | G06F 17/30286 |
| 2011/0093900 | A1* | 4/2011 | Patel | H04N 7/17318 |
| | | | | 725/54 |
| 2013/0173812 | A1* | 7/2013 | Ezell | H04L 65/1016 |
| | | | | 709/228 |
| 2013/0254457 | A1* | 9/2013 | Mukker | G06F 11/1441 |
| | | | | 711/103 |
| 2014/0181395 | A1* | 6/2014 | Vincent | G06F 11/1456 |
| | | | | 711/111 |
| 2014/0181396 | A1* | 6/2014 | Vincent | G06F 3/0605 |
| | | | | 711/111 |
| 2014/0304393 | A1* | 10/2014 | Annamalaisami | H04L 43/04 |
| | | | | 709/224 |
| 2015/0248248 | A1* | 9/2015 | Trezise | G11B 23/049 |
| | | | | 711/103 |
| 2015/0371426 | A1* | 12/2015 | Levy | G06T 13/80 |
| | | | | 345/473 |
| 2016/0087940 | A1* | 3/2016 | Miller | G06F 9/45558 |
| | | | | 726/15 |
| 2017/0142174 | A1* | 5/2017 | Yamagishi | H04L 65/4076 |

* cited by examiner

READING AND WRITING A HEADER AND RECORD ON TAPE

BACKGROUND

The present invention relates to reading and writing data on a tape storage medium, and more particularly to reading and writing compressed and/or encrypted data on tape.

A tape drive is a data storage device that reads and writes data on a magnetic tape storage medium. Tape storage is typically used for offline backup and archival of data, meaning data is written to a tape, and the tape is removed (e.g., un-mounted) from the tape drive and stored in a tape library. If the data on the tape is needed at a later time (e.g., restoring lost or corrupted data), the tape may be re-mounted on a tape drive and the data restored to a storage medium (e.g., disk storage).

Data may be written to, or read from, a tape in segments called records. When writing a record on a tape, the tape drive may use a compression algorithm to reduce the size of the data. In some cases the size reduction may be very substantial (e.g., text data may compress to on tenth the original uncompressed size). When the record is written, the tape drive may also write metadata (e.g., a tape control symbol) indicating the compression algorithm used to compress the data. When a hosts requests that the tape drive read the record, the tape drive may detect the tape metadata to determine that the data in the record is compressed and identify the decompression algorithm needed to decompress the data. The tape drive reads the record from the tape medium, decompresses the data, and then provides the decompressed record to the host.

SUMMARY

As disclosed herein, a computer implemented method for reading a record on a storage device includes reading, by a processor, the record from the storage device, and generating, by a processor, a header corresponding to the record. The method further includes adding, by a processor, header information corresponding to the metadata to the header, and providing, by a processor, the header and the record to a host.

As disclosed herein, a computer implemented method for writing a record on a storage device includes receiving, by a processor, a header and the record from a host to be written to the storage device, and determining, by a processor, metadata included in header information corresponding to the header. The method further includes determining, by a processor, a write behavior specified by the metadata, and writing, by a processor, the metadata and the record to the storage device according to the write behavior.

As disclosed herein, a computer program product for reading a record on a storage device includes one or more computer readable storage media and program instructions stored on the one or more computer readable storage media. The program instructions include instructions executable by a computer to perform reading, by a processor, the record from the storage device. The program instruction further include instructions executable by a computer to perform generating, by a processor, a header corresponding to the record, and determining, by a processor, metadata corresponding to the record. The program instruction further include instructions executable by a computer to perform adding, by a processor, header information corresponding to the metadata to the header, and providing, by a processor, the header and the record to a host.

DETAILED DESCRIPTION

A tape storage medium (hereinafter, tape) is a sequential access, removable, storage device. A tape drive reads and writes records sequentially on a tape. A tape drive may be capable of performing data compression on a record prior to writing the record to a tape. If data compression is performed by the tape drive, the tape drive may store metadata (e.g., a tape control symbol) on the tape to indicate the record is compressed and also to identify the compression algorithm used to compress the record. The metadata (i.e., tape metadata) is data stored on the tape, but only accessible to the tape drive. The tape metadata is not returned as part of a record that is read.

When the tape drive receives a request to read a record, the tape drive may detect tape metadata corresponding to the record, and use the tape metadata to aid in the read operation. The tape metadata may indicate to the tape drive that the record has been compressed and identify the compression algorithm used, enabling the tape drive to determine the decompression algorithm required to decompress the record. The tape drive may use the decompression algorithm to decompress the record prior to providing the record to the requesting host.

Situations may arise when it is beneficial to read and write the compressed data on tape, without the overhead of decompressing the data during the read operation and then (re)compressing the data during the write operation. However, the tape metadata that identifies characteristics of the data as it is exists on tape (e.g., indicating the data is compressed, and the compression algorithm) is not passed to the host during a read operation, nor is it accepted from the host during a write operation. As a result, if compressed data is read and provided to the host, the information (i.e., tape metadata) identifying the compression algorithm used to compress the data is lost. When the already-compressed data is rewritten to the tape, there will be no tape metadata to indicate the data is compressed or the compression algorithm used. In some embodiments, data compression includes both data compression and data encryption operations, and data decompression includes both data decompression and data decryption operations.

Scenarios have been observed where reading and/or writing compressed data may be beneficial. For example, when transferring large amounts of data, the transfer may complete more quickly if the compressed data is transferred, and then decompressed on the host. Similarly, if writing large amounts of data to a tape, it may faster to transfer compressed data to the tape drive. Additionally, when migrating data from an older tape to a newer tape and it may greatly reduce migration time if the compressed data could read from one tape and written to a second tape without the overhead of decompressing and recompressing each record. The embodiments disclosed herein generally address the above-described problems.

Figure 1:
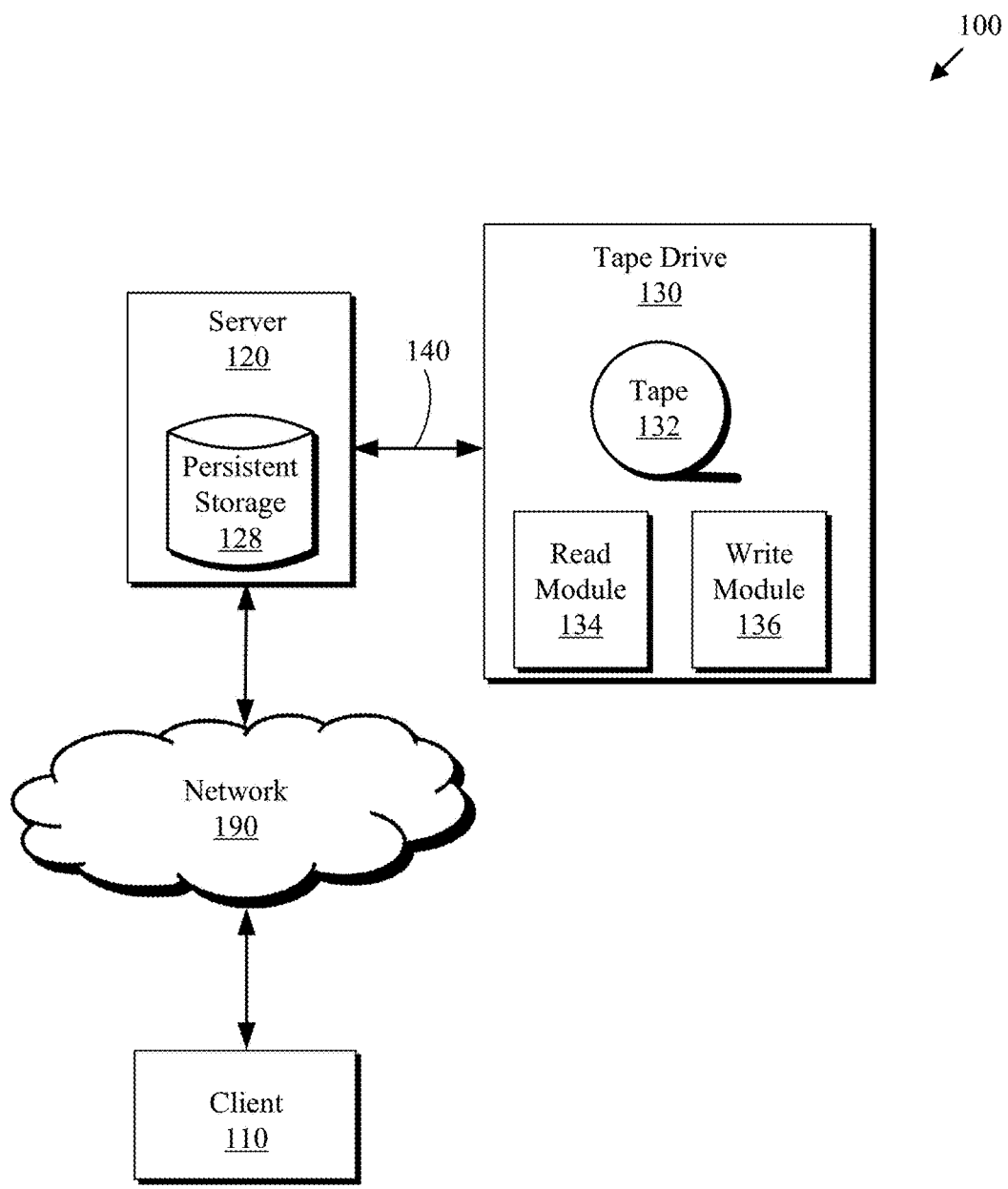
FIG. 1 is a functional block diagram depicting a computing environment, in accordance with at least one embodiment of the present invention.

The present invention will now be described in detail with reference to the Figures. FIG. 1 is a functional block diagram depicting a computing environment 100 in accordance with at least one embodiment of the present invention. Computing environment 100 includes a client 110 and a server 120 which can be smart phones, tablets, desktop computers, laptop computers, specialized computer servers, or any other computer systems, known in the art, capable of communicating over network 190. In general, client 110 and server 120 are representative of any electronic devices, or combination of electronic devices, capable of executing machine-readable program instructions, as described in greater detail with regard to FIG. 5.

Server 120 may be a computing device providing services to client 110. Server 120 may be, for example, a database server, file server, mail server, print server, web server, gaming server, or application server. In some embodiments, client 110 is accessing a web based banking application that is hosted by server 120. In other embodiments, server 120 is a mail server providing client 110 with an email service. In yet other embodiments, server 120 is a database server providing database services to client 110.

As depicted, server 120 is connected to a tape drive 130 over connection 140. Connection 140 may be a SCSI, a Fibre Channel, SATA, USB, FireWire, FICON™, or any other connection interface familiar to those of skill in the art. Tape drive 130 may be any device that reads and writes sequential data on a storage device (e.g., a magnetic tape storage medium), such as tape 132. Tape 132 may be any of differing physical configurations, such as, for example, a reel, a cassette, or a cartridge that are able to be mounted and removed from tape drive 130. Tape 132 may be comprised of one or more tapes stored in a tape library. In some embodiments, tape drive 130 supports a bypass mode that enables tape drive 130 to read and/or write compressed data without losing any tape metadata that corresponding to the compressed data.

Tape drive 130 also includes read module 134, and write module 136. Read module 134 may be configured to process a read request from a server (e.g., server 120). Read module 134 may support traditional tape drive read operations familiar to those of skill in the art. Additionally, read module 134 may be configured to support a bypass mode which enables tape drive 130 to read and provide compressed data to a host without the overhead of decompressing the data. In some embodiments, when bypass mode is enabled, read module 134: (i) reads a compressed record (data) from tape 132, without performing any data decompression operations; (ii) collects any tape metadata corresponding to the compressed record; (iii) converts the collected tape metadata to header information; (iv) stores the header information in a header; and (v) provides the header and the compressed record to server 120. Providing the tape metadata information in a header as part of the read operation may enable server 120 to determine the compression algorithm used to compress the data, and therefore enable server 120 to decompress the data, if needed, after the read operation has completed.

Write module 136 may be configured to process a write request from a server (e.g., server 120). Write module 136 may support traditional tape drive write operations familiar to those of skill in the art. Additionally, write module 136 may be configured to support a bypass mode which enables tape drive 130 to accept compressed data from a host, and write the compressed data to tape 132 without the overhead of compressing the data. In some embodiments, when bypass mode is enabled, write module 136: (i) receives a header and compressed record from server 120; (ii) converts any header information included in the header to tape metadata; (iii) determines any write behavior specified by the tape metadata; and (iv) writes, according to the write behavior, the tape metadata and the compressed record to tape 132.

As depicted, server 120 includes persistent storage 128 which may include important production data that is vital to the daily activities of an organization (e.g., the data in a production database). In some embodiments, tape drive 130 and tape 132 perform a backup of data stored on persistent storage 128. In other embodiments, server 120 accesses tape drive 130 and tape 132 to recover lost or corrupted data from backup data stored on tape 132.

In the depicted embodiment, client 110 and server 120 are separate computers, however, in other embodiments, client 110 and server 120 may coexist on a single computer. In yet other embodiments, client 110 and server 120 are procured from a cloud environment.

Persistent storage 128 may be any non-volatile storage media known in the art. For example, persistent storage 128 can be implemented with a tape library, optical library, one or more independent hard disk drives, or multiple hard disk drives in a redundant array of independent disks (RAID). Similarly, data on persistent storage 128 may conform to any suitable storage architecture known in the art, such as a file, a relational database, an object-oriented database, and/or one or more tables.

Client 110, server 120, and other electronic devices (not shown) communicate over network 190. Network 190 can be, for example, a local area network (LAN), a wide area network (WAN) such as the Internet, or a combination of the two, and include wired, wireless, or fiber optic connections. In general, network 190 can be any combination of connections and protocols that will support communications between client 110 and server 120 in accordance with an embodiment of the present invention.

Figure 2:
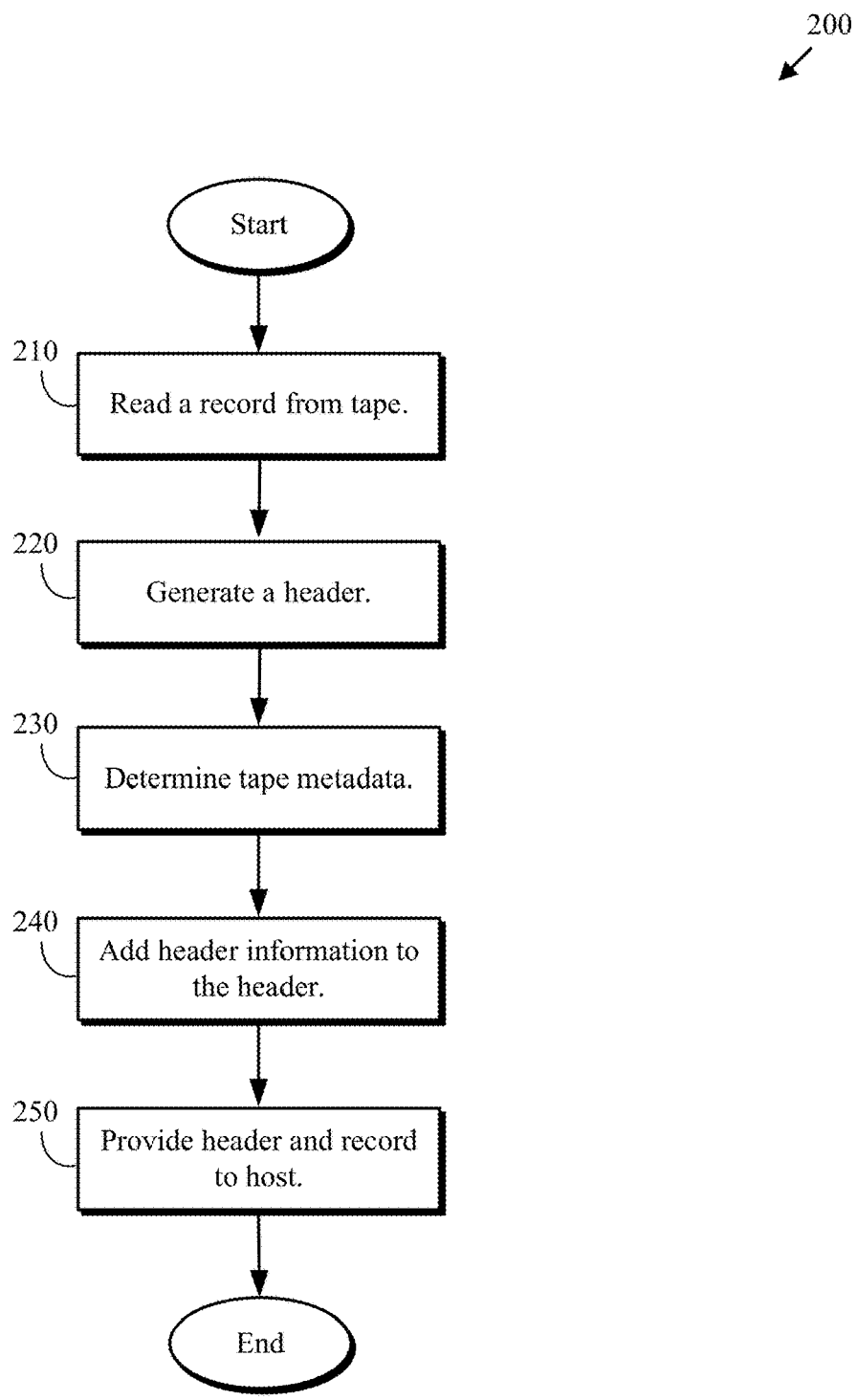
FIG. 2 is a flowchart depicting a read method, in accordance with at least one embodiment of the present invention.

FIG. 2 is a flowchart depicting read method 200, in accordance with at least one embodiment of the present invention. As depicted, read method 200 includes reading (210) a record from tape, generating (220) a header, determining (230) tape metadata, adding (240) header information to the header, and providing (250) the header and the record to a host. Read method 200 enables drive 130 to bypass tape drive decompression operations and provide compressed data and corresponding tape metadata to server 120.

Reading (210) a record from tape may include read module 134 receiving a request from server 120 to read a record from tape 132. Read module 134 may use techniques familiar to those of skill in the art to locate and read the record. In some embodiments, tape drive 130 is in bypass mode, and the request is to provide a record that is compressed (e.g., bypassing the decompression operations of disk drive 130).

Generating (220) a header may include read module 134 creating a set of data to be added to the beginning of a record that is read from tape 132. The purpose of the header may be to represent tape metadata. Tape metadata may identify characteristics of the record that is read from tape 132 (e.g., compression characteristics, file mark, end of record, and the like). In some embodiments, the generated header is eight bits (one byte) in length. Each bit may represent the presence of one type of metadata, allowing the header to indicate the presence of zero to eight metadata references. In other embodiments, the header is variable length with the first byte indicating the size of the header. In some embodiments, the header is initialized to all zero values, indicating the absence of any tape metadata, and only bits indicating the presence of metadata must be set to a one value in the header. In other embodiments, the header is not initialized to any specific value, and each bit in the header must be set to indicate whether or not metadata corresponding to the bit is present.

Determining (230) tape metadata may include read module 134 detecting tape metadata corresponding to a record read from tape 132. The tape metadata may indicate that the record is compressed, the compression algorithm used, and an end of record indicator. In some embodiments, the tape metadata is located preceding the record to be read from tape 132. In other embodiments, the tape metadata is located following the record to be read from tape 132. In another embodiment, the tape metadata is located both preceding and following the record to be read from tape 132.

Adding (240) header information to the header may include read module 134 representing all tape metadata corresponding to a record read from tape 132 in the header. In some embodiments, the tape metadata is converted (e.g., mapped) to a bit string that is stored in the header. Each bit in the header may represent one unique metadata value. In other embodiments, each metadata value is included in the header with no conversion required. In some embodiments, there is no metadata corresponding to the record read from tape 132, and an eight bit header containing all zeros is provided to indicate the absence of tape metadata corresponding to the current record.

Providing (250) the header and the record to a host may include read module 134 passing both the generated header and the record read from tape 132 to a host (e.g., server 120). In some embodiments, the record is in compressed format, and the header includes tape metadata indicating the compression algorithm used to compress the record. In some embodiments, the header and record are provided to a host as a single record. In other embodiments, the header and record are provided as separate data structures. In another embodiment, bypass mode is deactivated, and no header is generated or passed to the host (e.g., server 120) during a read operation.

Figure 3:
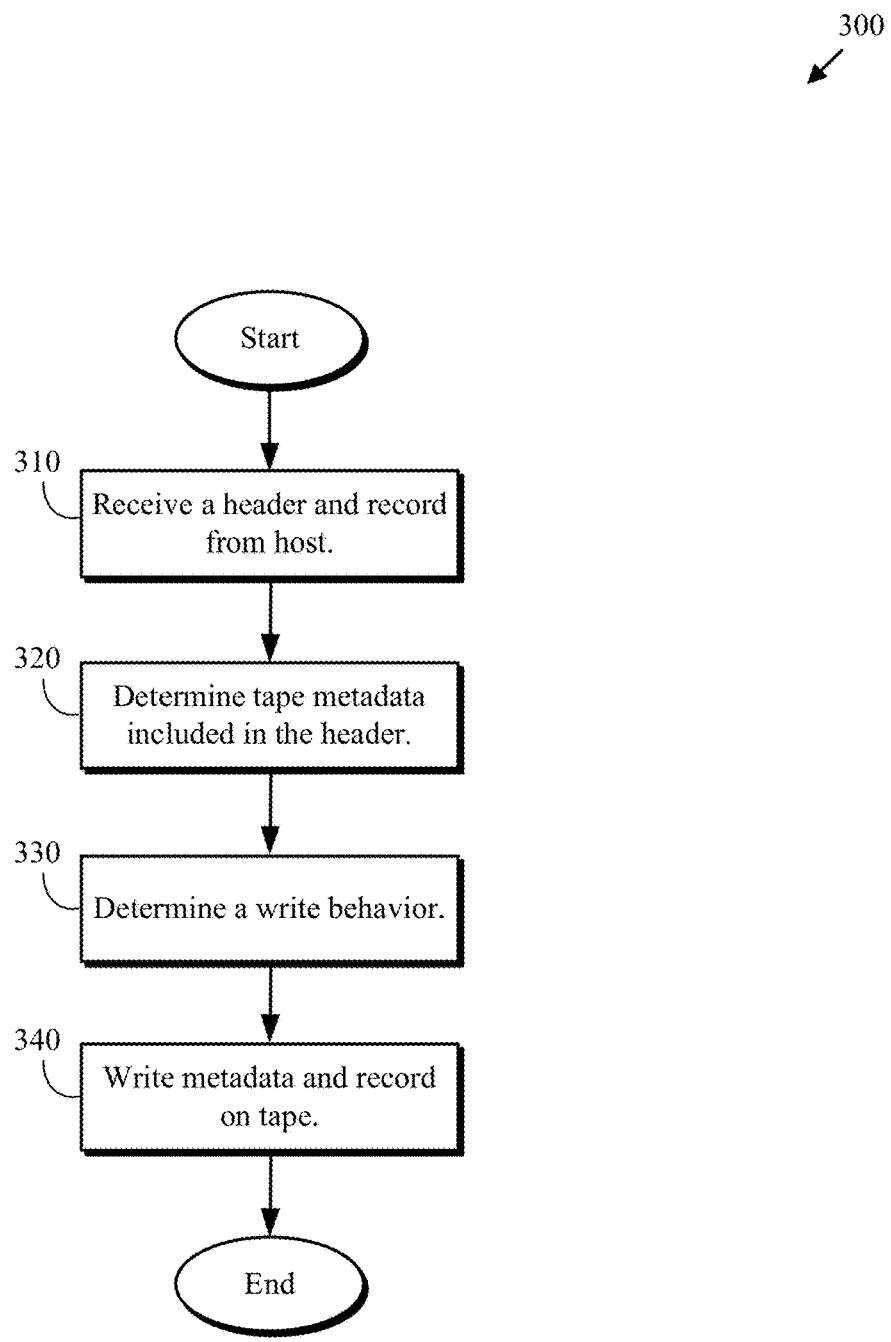
FIG. 3 is a flowchart depicting a write method, in accordance with at least one embodiment of the present invention.

FIG. 3 is a flowchart depicting a write method 300, in accordance with at least one embodiment of the present invention. As depicted, write method 300 includes receiving (310) a header and record from a host, determining (320) tape metadata included in the header, determining (330) a write behavior, and writing (340) the metadata and the record on tape. Write method 300 enables tape drive 130 to bypass tape drive data compression operations, and write previously compressed data and corresponding tape metadata to on tape 132.

Receiving (310) a header and record from a host may include write module 136 receiving a request from server 120 to write the record to tape 132. In some embodiments, tape drive 130 is in bypass mode, and the request is to write a record that is already compressed (e.g., bypassing the compression operations of disk drive 130). When tape drive 130 is in bypass mode, write module 136 may use information contained in the supplied header to identify tape metadata corresponding to the supplied record. Write module 136 may use techniques familiar to those of skill in the art to locate the proper write location on tape 132 prior to writing the compressed record.

Determining (320) tape metadata included in the header may include write module 136 parsing information provided in the header to identify metadata corresponding to the record to be written. The contents of the header may represent tape metadata that identifies characteristics of the record to be written to tape 132 (e.g., compression algorithm, file mark, end of record, and the like). In some embodiments, the header is eight bits (one byte) in length. Each bit may represent the presence of one type of metadata, allowing the header to indicate the presence of zero to eight metadata references. In other embodiments, the header is variable length with the first byte indicating the size of the header. In some embodiments, the header is initialized to all zero values, indicating the absence of any tape metadata, and only bits indicating the presence of tape metadata must be set to a one value in the header. In other embodiments, the header is not initialized, and each bit in the header must be set to indicate whether or not tape metadata corresponding to the bit is present.

Determining (330) a write behavior may include write module 136 converting (mapping) all header information represented in a header to tape metadata. The tape metadata may indicate a write behavior to be carried out by write module 136. In some embodiments, the write behavior indicates that the tape metadata is written to tape 132 preceding the record. In other embodiments, the write behavior indicates the tape metadata is written to tape 132 following the record. In another embodiment, the write behavior indicates tape metadata is written to tape 132 both preceding and following the record. In some embodiments, the header identifies no tape metadata (e.g., the eight bit header contains eight zero values), and no additional metadata is written to tape 132.

Writing (340) the metadata and the record on tape may include write module 136 detecting that tape drive 130 is in bypass mode and writing the record to and corresponding metadata to tape 132. Write module 136 may use the write behavior identified during determining operation 130 to write the tape metadata in the identified locations (e.g., prior to and/or following the record). In some embodiments, there is no metadata to be written, and only the record is written.

Figure 4A:
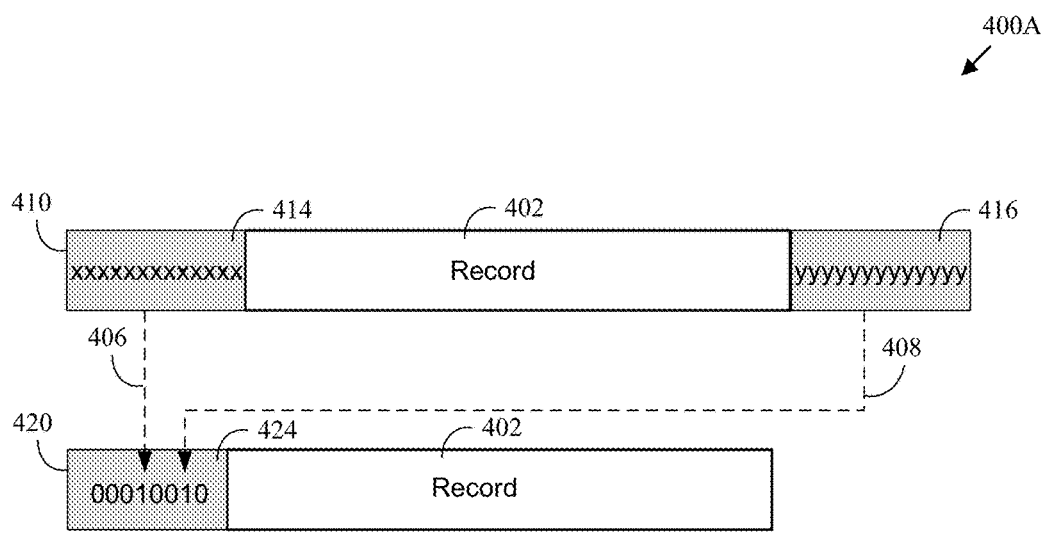
FIG. 4A depicts an example of a tape read operation using bypass mode, in accordance with at least one embodiment of the present invention.

FIG. 4A depicts an example 400A of a tape read operation using bypass mode, in accordance with at least one embodiment of the present invention. As depicted, example 400A includes tape segment 410 and read buffer 420. Tape segment 410 is a portion of a tape (e.g., tape 132) containing compressed record 402, and two occurrences of metadata (e.g., tape control symbols) that identify information corresponding to record 402. The tape drive (i.e.; tape drive 130) performing the read operation is operating in bypass mode, and therefore will bypass all tape drive compression and decompression operations.

In example 400A, tape drive 130 receives a request to read record 402. During the read operation, record 402 is retrieved from tape 132 and placed in read buffer 420. Tape drive 130 also creates header 424 in read buffer 420. Additionally, all metadata corresponding to record 402 is (e.g., metadata 414 and 416) is retrieve by tape drive 130. Metadata 414 is converted (406) to a value that is stored in header 424. Metadata 416 is also converted (408) to a value that is stored in header 424. The contents of read buffer 420 are provided to the host.

Figure 4B:
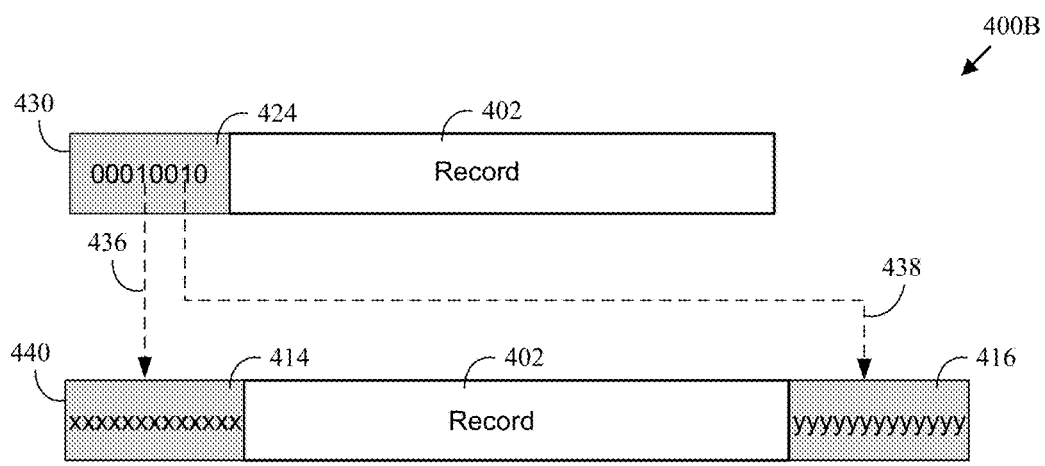
FIG. 4B depicts an example of a tape write operation using bypass mode, in accordance with at least one embodiment of the present invention.

FIG. 4B depicts an example 400B of a tape write operation using bypass mode, in accordance with at least one embodiment of the present invention. As depicted, example 400B includes write buffer 430 and tape segment 440. Write buffer 430 includes record 402 and header 424 (the same header and record that were in read buffer 420 as depicted in FIG. 4A). The tape drive (i.e.; tape drive 130) is operating in bypass mode, and therefore will bypass all tape drive compression and decompression operations.

Tape drive 130 receives a request to write record 402. Tape drive 130 receives record 402 and header 424 in write buffer 430. Tape drive 130 parses header 424 to determine if any tape metadata corresponding to record 402 is represented in the header information. The header information represents two metadata instances (indicated by the one values in the header information). Conversion 436 results in metadata 414 and conversion 438 results in metadata 416. The contents of write buffer 430 are written to tape segment 440. After conversion, the record and metadata written to tape segment 440 is equivalent to what was originally read from tape segment 410.

In the depicted example compressed data was read from tape and rewritten to tape without loss of important tape metadata. The example may be demonstrating the migration of data a tape that was written using older technology to a tape using newer technology, without the overhead of decompressing and re-compressing data. Other examples may include only reading compressed data, or only writing compressed data. It should also be noted that data written by a tape drive using bypass mode may be successfully read (using tape drive decompression technology) by a tape drive with bypass mode deactivated.

Figure 5:
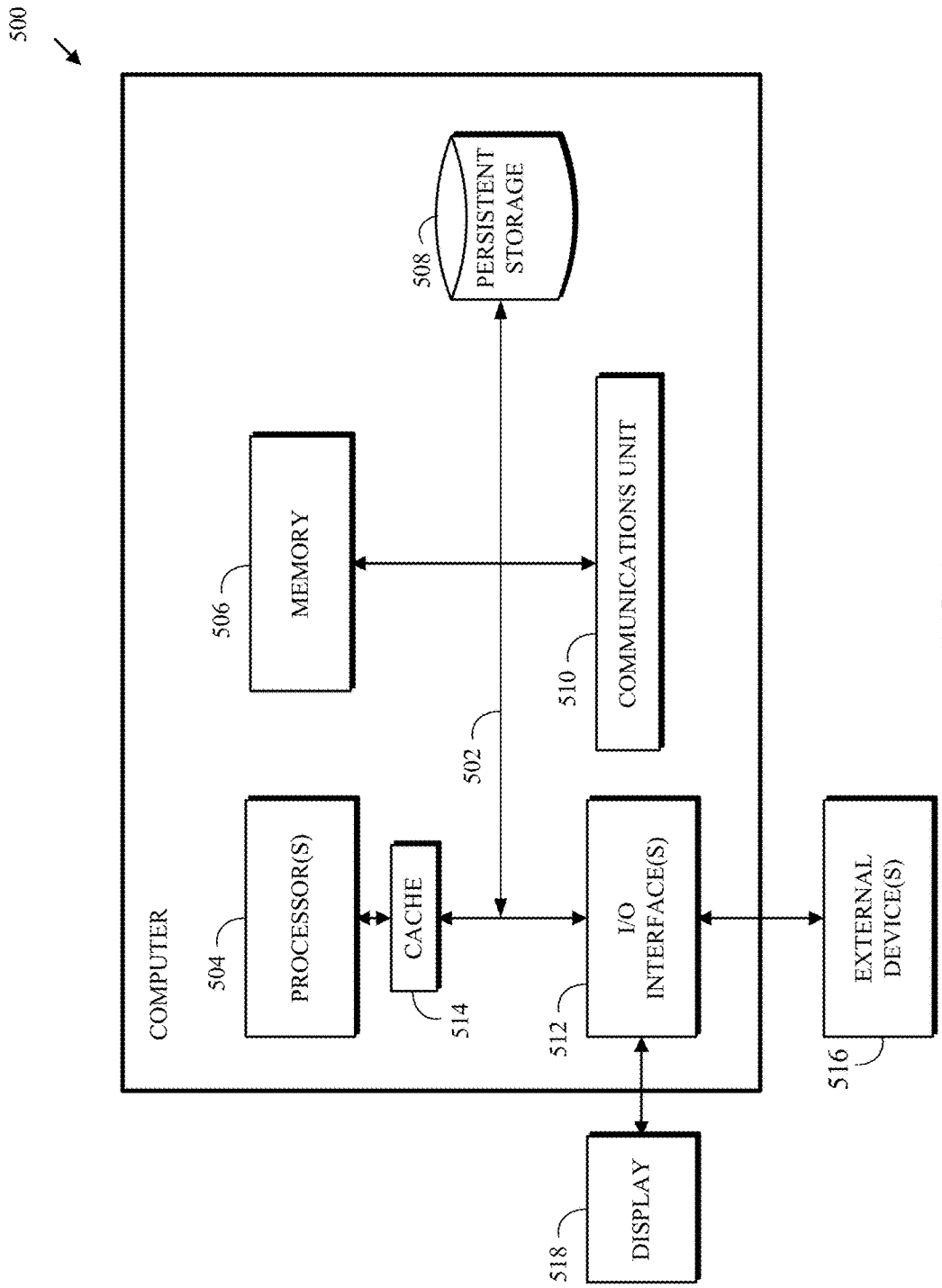
FIG. 5 is a block diagram depicting various components of one embodiment of a computer suitable for executing the methods disclosed herein.

FIG. 5 depicts a block diagram of components of a computer system 500, which is an example of systems such as client 110 and server 120 within computing environment 100 of FIG. 1, in accordance with an embodiment of the present invention. It should be appreciated that FIG. 5 provides only an illustration of one implementation and does not imply any limitations with regard to the environments in which different embodiments can be implemented. Many modifications to the depicted environment can be made.

Client 110 and server 120 include processor(s) 504, cache 514, memory 506, persistent storage 508, communications unit 510, input/output (I/O) interface(s) 512 and communications fabric 502. Communications fabric 502 provides communications between cache 514, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer readable storage media. In this embodiment, memory 506 includes random access memory (RAM). In general, memory 506 can include any suitable volatile or non-volatile computer readable storage media. Cache 514 is a fast memory that enhances the performance of processor(s) 504 by holding recently accessed data, and data near recently accessed data, from memory 506.

Program instructions and data used to practice embodiments of the present invention, e.g., read method 200 and write method 300 are stored in persistent storage 508 for execution and/or access by one or more of the respective processor(s) 504 via cache 514. In this embodiment, persistent storage 508 includes a magnetic hard disk drive. Alternatively, or in addition to a magnetic hard disk drive, persistent storage 508 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 510, in these examples, provides for communications with other data processing systems or devices, including resources of client 110 and server 120. In these examples, communications unit 510 includes one or more network interface cards. Communications unit 510 may provide communications through the use of either or both physical and wireless communications links. Program instructions and data used to practice embodiments of read method 200 and write method 300 may be downloaded to persistent storage 508 through communications unit 510.

I/O interface(s) 512 allows for input and output of data with other devices that may be connected to each computer system. For example, I/O interface(s) 512 may provide a connection to external device(s) 516 such as a keyboard, a keypad, a touch screen, a microphone, a digital camera, and/or some other suitable input device. External device(s) 516 can also include portable computer readable storage media such as, for example, thumb drives, portable optical or magnetic disks, and memory cards. Software and data used to practice embodiments of the present invention can be stored on such portable computer readable storage media and can be loaded onto persistent storage 508 via I/O interface(s) 512. I/O interface(s) 512 also connect to a display 518.

Display 518 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer implemented method for reading a record on a storage device, the method comprising:
    initiating, by a processor, a bypass mode, wherein the bypass mode enables the reading of a compressed record absent a data decompression operation;
    reading, by a processor, the compressed record, wherein tape metadata corresponding to the compressed record is collected;
    generating, by a processor, a header corresponding to the compressed record;
    converting, by a processor, the collected tape metadata to a header information, wherein the header information is stored in a header;
    adding, by a processor, the header information corresponding to the collected tape metadata to the header; and
    providing, by a processor, the header and the compressed record to a host.

2. The method of claim 1, wherein the header comprises eight bits used to represent the header information.

3. The method of claim 1, further comprising initializing the header to all zero values to indicate an absence of any metadata.

4. The method of claim 1, wherein the header information can identify more than one occurrence of metadata.

5. The method of claim 1, further comprising converting the metadata to the header information.

6. The method of claim 1, wherein the storage device is a tape storage medium and the metadata is tape metadata.

7. The method of claim 1, further comprising determining if the bypass mode is enabled for a tape drive.

8. A computer implemented method for writing a record on a storage device, the method comprising:
- receiving, by a processor, a header and a compressed record from a host to be written to the storage device;
- determining, by a processor, metadata included in header information corresponding to the header;
- determining, by a processor, a write behavior specified by the metadata; and
- writing, by a processor, the metadata and the compressed record to the storage device according to the write behavior.

9. The method of claim 8, wherein contents of the record are compressed.

10. The method of claim 8, wherein the header comprises eight bits used to represent the header information.

11. The method of claim 8, wherein determining the write behavior comprises converting the header information to the metadata.

12. The method of claim 8, wherein the header information identifies zero or more metadata occurrences.

13. The method of claim 8, wherein the header information comprising all zero values indicates an absence of any metadata.

14. The method of claim 8, further comprising determining if a bypass mode is enabled for a tape drive.

15. A computer program product for reading a record on a storage device, the program product comprising:
- one or more computer readable tangible storage media and program instructions stored on the one or more computer readable storage media, wherein the one or more computer readable tangible storage media are not transitory signals per se, the program instructions executable by a computer to perform:
- initiating, by a processor, a bypass mode, wherein the bypass mode enables the reading of a compressed record absent a data decompression operation reading, by a processor, the compressed record, wherein tape metadata corresponding to the compressed record is collected;
- generating, by a processor, a header corresponding to the compressed record;
- converting, by a processor, the collected tape metadata to a header information, wherein the header information is stored in a header;
- adding, by a processor, the header information corresponding to the collected tape metadata to the header; and
- providing, by a processor, the header and the compressed record to a host.

16. The computer program product of claim 15, wherein the header comprises eight bits used to represent the header information.

17. The computer program product of claim 16, wherein the program instructions comprise instructions for initializing the header to all zero values to indicate an absence of any metadata.

18. The computer program product of claim 15, wherein the header information can identify more than one occurrence of metadata.

* * * * *